United States Patent
Ko et al.

[11] Patent Number: 5,519,444
[45] Date of Patent: May 21, 1996

[54] PHASE SYNCHRONIZING LOOP APPARATUS FOR DIGITAL AUDIO SIGNALS

[75] Inventors: Yong Chul Ko, Kyeongki-do; Jung Shik Yoon, Seoul both of Rep. of Korea

[73] Assignee: Hyundai Electronics Ind. Co., Ltd., Kyeongki-do, Rep. of Korea

[21] Appl. No.: 212,898

[22] Filed: Mar. 14, 1994

[30] Foreign Application Priority Data

Mar. 17, 1993 [KR] Rep. of Korea ............... 1993-4063

[51] Int. Cl.$^6$ ................................................. H04N 5/05
[52] U.S. Cl. ................. 348/515; 348/512; 375/362; 375/376
[58] Field of Search ........................... 348/512, 513, 348/514, 515, 516, 517, 536, 537; 375/371, 373, 376, 362, 360; H04N 5/05

[56] References Cited

U.S. PATENT DOCUMENTS 5,351,092  9/1995  Poimboeuf et al. ............... 348/512

Primary Examiner—Victor R. Kostak
Assistant Examiner—Nathan J. Flynn
Attorney, Agent, or Firm—Wenderoth, Lind & Ponack

[57] ABSTRACT

In a phase synchronizing loop apparatus for digital audio signals, a clock operation is controlled in accordance with a plurality of audio data formats, allowing a data transmission clock to be generated using a phase synchronizing loop. The apparatus includes an edge detector for detecting an edge of applied data, a clock generator for retaining the signal from the edge detector for a predetermined period of time to generate a clock signal, first and second phase synchronizing loops for detecting a phase difference between the clock signal and the oscillation output of a voltage controlled oscillator, a controller for generating a control signal in accordance with the audio data formats, and a display for discriminating a synchronization state and displaying an indication thereof.

5 Claims, 10 Drawing Sheets

FIG. 9(A)

1) $f_S = 48 KHz$

| TRANSMISSION RATE | 64 | | 128 | | 192 | |
|---|---|---|---|---|---|---|
| CHANNEL NUMBER | 2 | 4 | 2 | 4 | 2 | 4 |
| $f_{SYNC}$ (Hz) | 41.667 | | | | | |
| SYNC WORD (μs) | 93.750 | 46.875 | 46.875 | 23.438 | 31.250 | 15.625 |
| T (μs/BIT) | 7.813 | 3.906 | 3.906 | 1.193 | 2.604 | 1.302 |
| $T_{1WD}$ (μsec) | 88.0 | 44.0 | 44.0 | 22.0 | 30.0 | 15.0 |
| $T_{2WD}$ (μsec) | 82.0 | | | | | |
| $f_{SIG1}$ (Hz) | $f_{SYNC}$ | | | | | |
| N1 | 512 - | | | | | |
| $f_{REF1}$ (Hz) | $f_{SIG}$ | | | | | |
| $f_{C1}$ (KHz) | 21.333 | | | | | |
| $f_{SIG2}$ (Hz) | $f_{C1}$ | | | | | |
| N2 | 144 | 72 | 72 | 36 | 48 | 24 |
| N3 | 6 | 12 | 12 | 24 | 18 | 36 |
| $f_{REF2}$ (Hz) | $f_{SIG2}$ | | | | | |
| $f_{C2}$ (KHz) | 18.432 | | | | | |
| $f_B$ (KHz) | 128 | 256 | 256 | 512 | 384 | 768 |

FIG. 9(B)

2) $f_s = 44.1\text{KHz}$

| TRANSMISSION RATE | 64 | | 128 | | 192 | |
|---|---|---|---|---|---|---|
| CHANNEL NUMBER | 2 | 4 | 2 | 4 | 2 | 4 |
| $f_{SYNC}$ (Hz) | 38.281 | | | | | |
| SYNC WORD (μs) | 93.750 | 46.875 | 46.875 | 23.438 | 31.250 | 15.625 |
| T (μs/BIT) | 7.813 | 3.906 | 3.906 | 1.193 | 2.604 | 1.302 |
| $T_{1WD}$ (μsec) | 88.0 | 44.0 | 44.0 | 22.0 | 30.0 | 15.0 |
| $T_{2WD}$ (μsec) | 82.0 | | | | | |
| $f_{SIG1}$ (Hz) | $f_{SYNC}$ | | | | | |
| N1 | 557 - | | | | | |
| $f_{REF1}$ (Hz) | $f_{SIG}$ | | | | | |
| $f_{C1}$ (KHz) | 21.333 | | | | | |
| $f_{SIG2}$ (Hz) | $f_{C1}$ | | | | | |
| N2 | 144 | 72 | 72 | 36 | 48 | 24 |
| N3 | 6 | 12 | 12 | 24 | 18 | 36 |
| $f_{REF2}$ (Hz) | $f_{SIG2}$ | | | | | |
| $f_{C2}$ (KHz) | 18.432 | | | | | |
| $f_B$ (KHz) | 128 | 256 | 256 | 512 | 384 | 768 |

FIG. 9(C)

3) $f_s = 32$KHz

| TRANSMISSION RATE | 64 | | 128 | | 192 | |
|---|---|---|---|---|---|---|
| CHANNEL NUMBER | 2 | 4 | 2 | 4 | 2 | 4 |
| $f_{SYNC}$ (Hz) | 27.778 | | | | | |
| SYNC WORD (μs) | 93.750 | 46.875 | 46.875 | 23.438 | 31.250 | 15.625 |
| T (μs/BIT) | 7.813 | 3.906 | 3.906 | 1.193 | 2.604 | 1.302 |
| $T_{1WD}$ (μsec) | 88.0 | 44.0 | 44.0 | 22.0 | 30.0 | 15.0 |
| $T_{2WD}$ (μsec) | 82.0 | | | | | |
| $f_{SIG1}$ (Hz) | $f_{SYNC}$ | | | | | |
| N1 | 768 - | | | | | |
| $f_{REF1}$ (Hz) | $f_{SIG}$ | | | | | |
| $f_{C1}$ (KHz) | 21.333 | | | | | |
| $f_{SIG2}$ (Hz) | $f_{C1}$ | | | | | |
| N2 | 144 | 72 | 72 | 36 | 48 | 24 |
| N3 | 6 | 12 | 12 | 24 | 18 | 36 |
| $f_{REF2}$ (Hz) | $f_{SIG2}$ | | | | | |
| $f_{C2}$ (KHz) | 18.432 | | | | | |
| $f_B$ (KHz) | 128 | 256 | 256 | 512 | 384 | 768 |

FIG. 10

LOGIC VALUE OF PULSE GENERATOR MEANS 21B

| INPUT | | | OUTPUT | |
|---|---|---|---|---|
| CLEAR | A | B | Q | /Q |
| L | X | X | L | H |
| X | H | X | L | H |
| X | X | L | L | H |
| H | L | ↑H | ↓ | ↑ |
| H | ↓L | H | | |
| ↑ | L | H | | |

FIG. 11

| fs | TRANSMISSION RATE | CHANNEL NUMBER | SK1 | SK2 | SK3 | REMARKS |
|---|---|---|---|---|---|---|
| ∞ | 0100 | 0<br>1 | 000<br>001 | 00 | 000<br>001 | fs: 48KHz<br>TRANSMISSION RATE:<br>128, 256,<br>512, 384, 768kbps<br>CHANNEL NUMBER: 2, 4 |
|  | 1000 | 0<br>1 | 001<br>010 |  | 001<br>010 |  |
|  | 1010 | 0<br>1 | 011<br>100 |  | 011<br>100 |  |
| 01 | 0100 | 0<br>1 | 000<br>001 | 01 | 000<br>001 | fs: 44.1KHz<br>TRANSMISSION RATE:<br>128, 256,<br>512, 384, 768kbps<br>CHANNEL NUMBER: 2, 4 |
|  | 1000 | 0<br>1 | 001<br>010 |  | 001<br>010 |  |
|  | 1010 | 0<br>1 | 011<br>100 |  | 011<br>100 |  |
| 10 | 0100 | 0<br>0 | 000<br>001 | 00 | 000<br>001 | fs: 32KHz<br>TRANSMISSION RATE:<br>128, 256,<br>512, 384, 768kbps<br>CHANNEL NUMBER: 2, 4 |
|  | 1000 | 1<br>0 | 001<br>010 |  | 001<br>010 |  |
|  | 1010 | 1<br>0 | 011<br>100 |  | 011<br>100 |  |

5,519,444

1

PHASE SYNCHRONIZING LOOP APPARATUS FOR DIGITAL AUDIO SIGNALS

FIELD OF THE INVENTION

This invention relates to a phase synchronizing loop apparatus for digital audio signals in digital picture systems, such as HDTV, digital video cassette recorders (D-VCRs), etc., and in particular to a phase synchronizing loop apparatus capable of extracting a sync signal from transmitted audio signals for generating a phase synchronizing clock signal.

BACKGROUND OF THE INVENTION

Digital picture systems in general convert picture and sound signals into a digital format. Examples of such systems include high definition TV (HDTV), digital video cassette recorder (D-VCRs), laser disk players (LDPs), etc. They must synchronize execution of the digitization of signals being treated with a system clock. Signals transmitted to such digital picture systems, after pretreated by a preliminary processor, are filtered to be frequency-synchronized in a phase synchronizing loop circuitry.

SUMMARY OF THE INVENTION

The object of the invention is to provide a phase synchronizing loop apparatus for digital audio signals for controlling a clock operation in accordance with a plurality of audio data formats and allowing a data transmission clock to be generated by a phase synchronizing loop.

To achieve this object of the invention, a phase synchronizing loop apparatus comprises an edge detector 10 for detecting an edge of applied data, a clock generator means 20 for retaining the signal from the edge detector for a determined period of time to generate an output signal, first and second phase synchronizing loops 30 and 40 including voltage controlled oscillator means and operating to detect a phase difference between the clock signal and the oscillation output of said voltage controlled oscillator means to determine the frequency and phase of said voltage controlled oscillator, a controller 50 capable of generating a control signal in accordance with the audio data formats, and a display 60 for executing a discrimination and an indication of synchronization on a basis of comparison between the outputs from the first and second phase synchronizing loops.

The clock generator means 20 comprises a first clock generator Z1 for retaining a clock with a time interval controlled in accordance with the audio data formats to generate the same, and a second clock generator 22 for retaining the output of the first clock generator 22 for a determined length of time.

The first phase synchronizing loop 30 comprises a first phase comparator 81 for phase-comparing the output of the second clock generator 22 and a reference signal to generate a phase difference, a first loop filter 32 for low-pass filtering the phase difference signal from the first phase comparator 31, a first voltage controlled oscillator 33 capable of oscillating a central frequency applied from the first loop filter 32 at 21.333 kilo Herz, and a multiplier 34 for variably multiplying the output of the first voltage controlled oscillator 33 at a plurality of multiplication rates.

The second phase synchronizing loop 40 comprises a second phase comparator 41 for phase-comparing the output for the first voltage controlled oscillator 33 and a reference

2 signal to generate a phase difference, a second loop filter 42 for low-pass filtering the phase difference signal from the second phase comparator 41, a second voltage controlled oscillator 43 for oscillating a central frequency applied from the second loop filter 42 at 21.883 kilo Herz, and a first and second dividers 44 and 45 for variably dividing the output of the second voltage controlled oscillator 43 at a plurality of division rates.

BRIEF DESCRIPTION OF THE DRAWINGS

FIGS. 9(A)–9(C) are tables of audio data formats and frequencies for fs=48 KHz, fs=44.1 KHz and fs=32 KHz, respectively;

FIG. 10 is a table showing logic values of a pulse generator 21B; and FIG. 11 is a table showing logic values of a control signal;

DETAILED DESCRIPTION OF THE PREFERRED EMBODIMENTS

Figure 1:
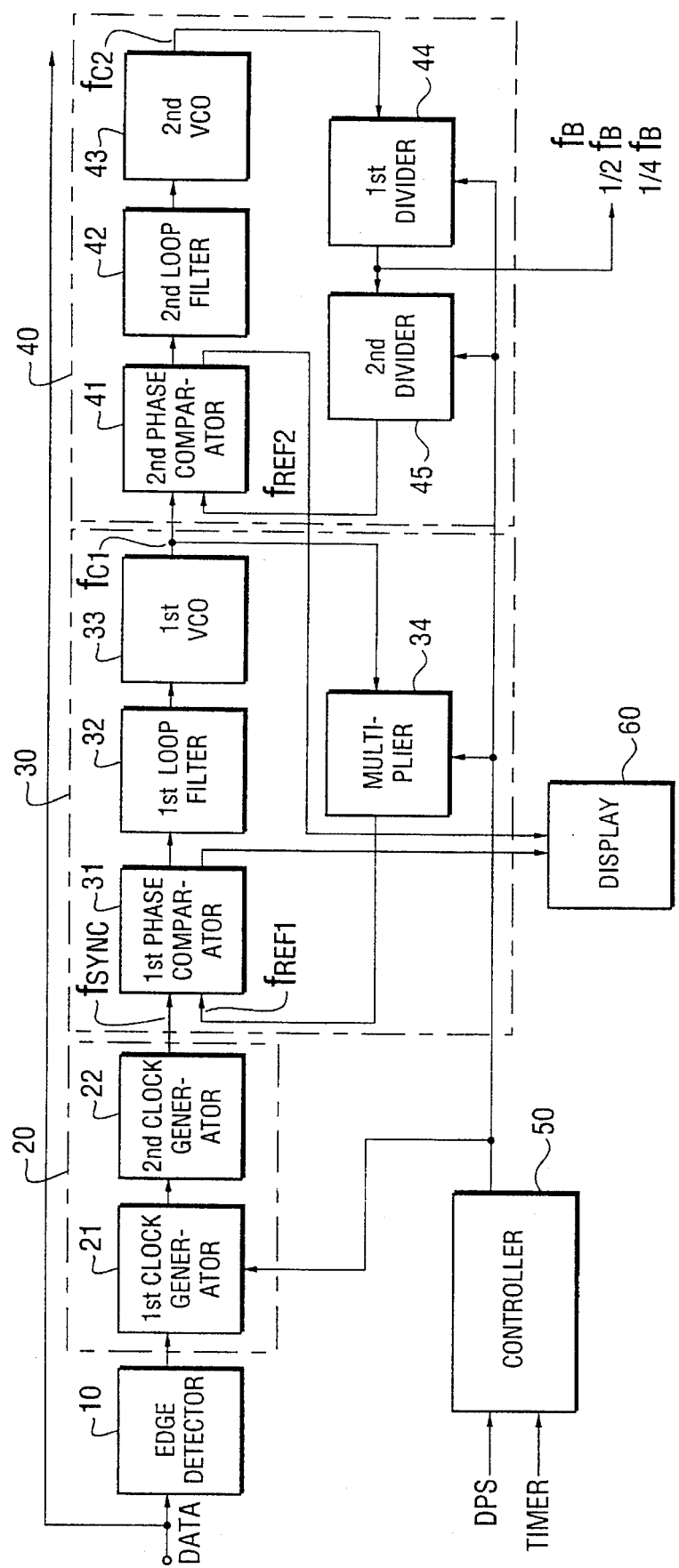
FIG. 1 shows a block diagram of a phase synchronizing loop apparatus according to the invention.
Figure 2A:
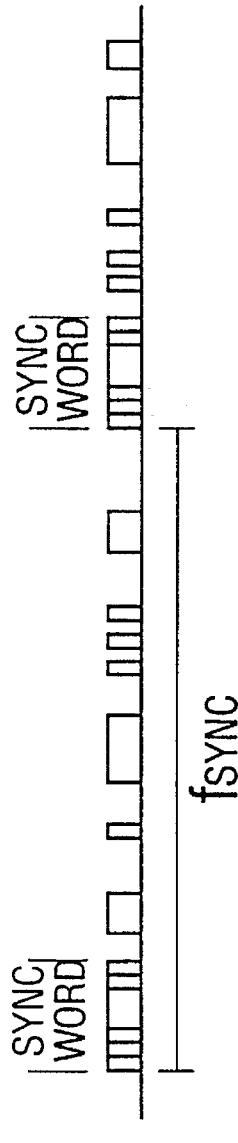
FIG. 2 shows a timing chart of the operations of the apparatus of FIG. 1.
Figure 2B:
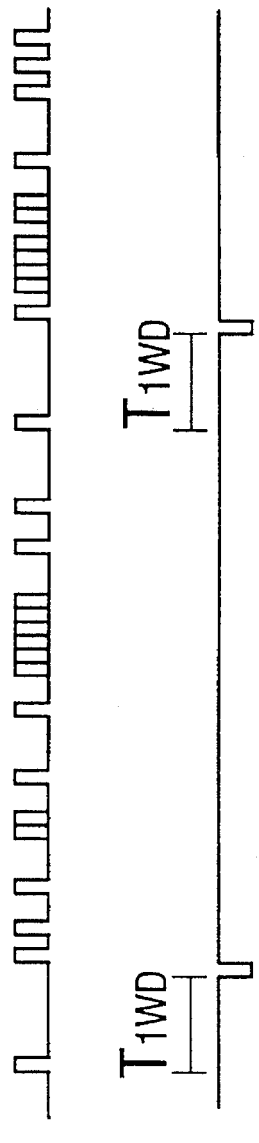
Figure 2C:
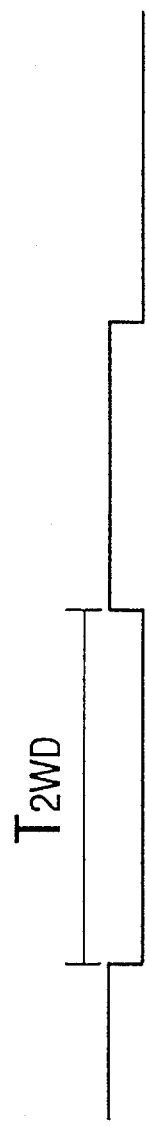
Figure 2D:
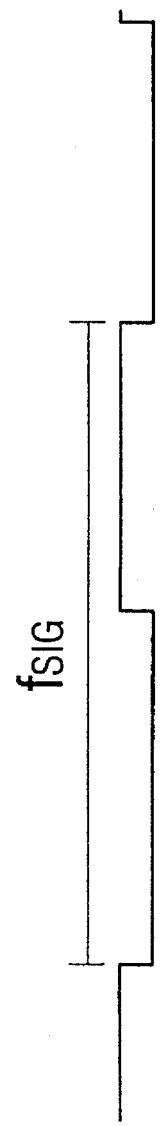
Figure 2E:
Figure 2F:
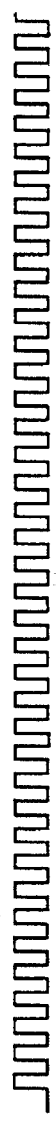

An embodiment of the invention will be described with reference to the accompanying drawings. The embodiment may be constructed as described in the foregoing Summary of the Invention.

The operation of the apparatus in question is described in particular with reference to FIG. 2 which shows a timing relationship of inputted data signals (A), detection signals (B) responding to detection of edges of the audio signals; output signal (C) of the first clock generator 21; output signal (D) of the second clock generator 22; input signal to the first phase comparator 31; and clock signal F eventually derived for data transmission.

The inputted data signal includes a 12-bit synchronization signal pattern which has all "1" bits such shown as "1111 1111 1111". The edge detector 10 detects rising and falling edges of each of the sync signal as per shown at (B) in FIG. 2. The signal from the edge detector 10 having a value "1" is applied to the clock generator 21 and is retained thereby for a determined period of time. The clock generator 21 applies a signal as per shown at C of FIG. 2. The configuration of the pulse signal from the clock generator thus varies in accordance with transmission rate or any other audio data formats. The second clock generator 22 converts the interval of pulses in the signal output from the first clock generator 21 to one cycle frequency at D of FIG. 2.

The first phase comparator 31 is applied at one terminal with the output signal $f^{SYNC}$ from the second clock generator 22 in the form of a signal E of FIG. 2, and at the other terminal with a reference signal$^{REF1}$ formed by the multiplier 34 which multiplies a signal $f^{C1}$ from the first voltage controlled oscillator 33 in accordance with audio formats. The comparator detects a phase difference in the rising edge of the two signals and generates a phase difference signal which is low-pass filtered through the first loop filter 32 into a voltage signal, the voltage signal being applied to the first voltage controlled oscillator 33. The oscillator 33 generates an oscillatory frequency varying according to the applied voltage. The central frequency of the first voltage controlled oscillator 33 is set to 21.333 kilo Herz. As the first phase loop is synchronized, the central frequency is fixed.

In order to providing a tolerant range of the phase synchronizing loop in accordance with the inputted frequencies and eventually acquiring a necessary high frequency, the first and the second phase synchronizing loops are provided, taking a phase difference between inputted signals and outputted frequency into account.

The second phase synchronizing loop 40 has the second phase comparator 41 which operates like the above mentioned first phase comparator 31 and has the applied frequency $f^{SYNC}$ and reference $f^{REF}$ both shown in FIG. 9(A). The second loop filter 42 also operates like the first loop filter 32, except filtered frequency and other factors. The second voltage controlled oscillator 43 maintains its high central frequency.

FIG. 9(A) Audio Data Format and Frequency

Figure 3:
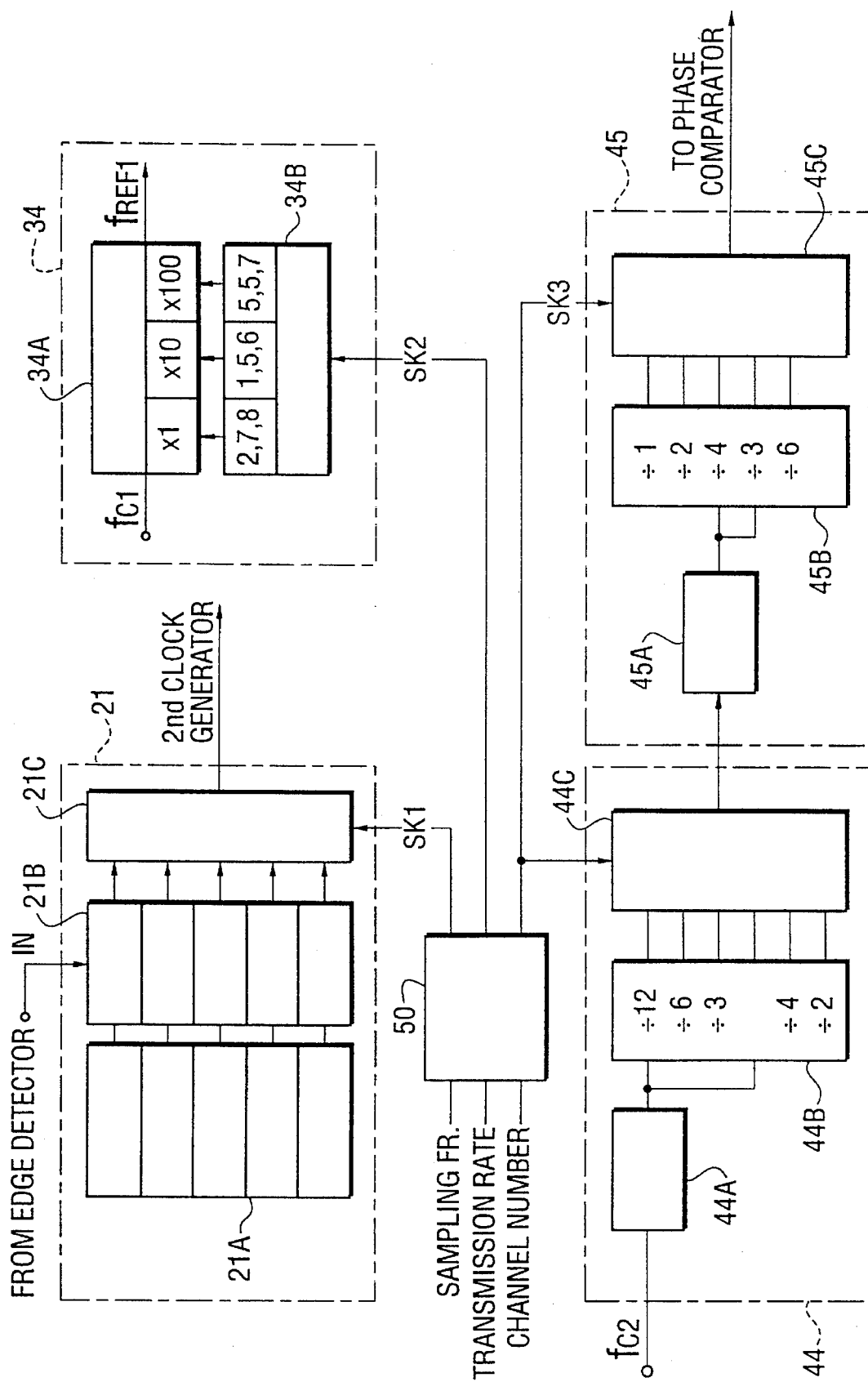
FIG. 3 is a block diagram of part of the apparatus of FIG. 1.

The clock generator 21 and multiplier 34 and dividers 44 and 45 are shown in details in FIG. 3. The first clock generator 21 as shown has a time constant source means 21a, a pulse generator means 21b and a first selector 21c. The time constants can be fixed by outwardly connected resistance and condenser and the source means may be designed to provide constants equivalent to $T^{1WD}$. The pulse generator means generates pulses according to a time constant applied. The first selector selects one of a plurality of pulse signals from the pulse generator means 21b in accordance with a control signal SK1 from the controller 50 and applies it to the second clock generator 22.

The multiplier 34 comprises a multiplication means 34a capable of multiplication by $10^0$, $10^1$, and $10^2$ and a loader means 34b for loading data in accordance with inputted audio format. The multiplier may has a desired multiplication factor in accordance with the value loaded by the loader means 34b. The loaded value is determined by the control signal SK2 from the controller 50.

The first divider 44 includes a first division means 44a capable of making a 12th division and a division means 44b having division numbers, 12, 6, 3, 4 and 2 and can apply a signal divided by one of the division numbers selected by a second selector 44c in accordance with a control signal SK3 from the controller 50. The second divider 45 includes a second division means 45a capable of making a 6th division and a division means 45b having division numbers, 1, 2, 4, 3 and 6, and can apply a signal divided by one of the division numbers selected by a third selector 45c in accordance with the control signal SK3 from the controller 50.

FIG. 9(B) Logic Value of Pulse Generator Means 21b

The controller 50 may be constituted by a digital signal processing unite for controlling sequence of the system and is applied with a sampling frequency fs and transmission rate and channel number for deriving control signals SK1, SK2 and SK3. FIG. 9(C) shows logic values for the respective control signals from the controller.

FIG. 9(C) Logic Value of Control Signals

Figure 4A:
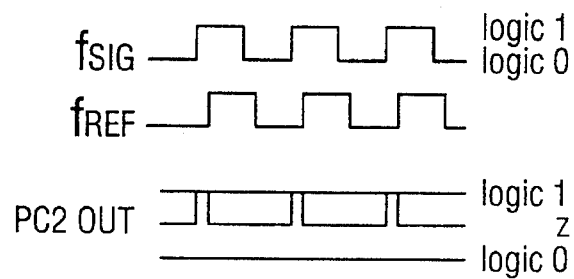
FIG. 4 is a timing chart of the operation of the second phase comparator of FIG. 1.
Figure 4B:
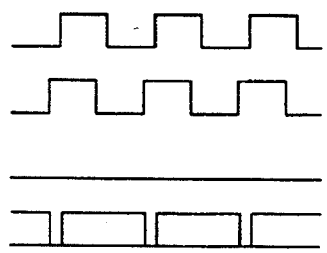

The second phase comparator 41 of FIG. 1 operates in timing shown FIG. 4. The phase comparator 41 may be constituted by a positive edge trigger having a tri-state output with its applied signal $f^{SIG}$ making count-up and its reference signal $f^{REF}$ making count-down. FIG. 4a and 4b show its output signal when the applied signal is shifted forwardly and backwardly, respectively, from the reference and FIG. 4b shows the similar signal, where logic1 designates a high level, logic 0, low level and z, impedance.

Figure 5:
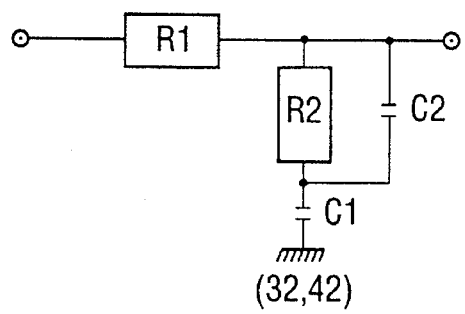
FIG. 5 is a block diagram of the first and second loop filters of FIG. 1.

FIG. 5 shows a detailed block diagram of the first and second loop filters 32 and 42. which may be constituted by resistances R1 and R2 and condensers C1 and C2 to form a secondary low-pass filter whose parameters are as follows:

transmission function:

$$H(s) = s^2 + s\zeta\omega ns + \omega n^2 = \frac{KoKd(s\tau_2 +1)/(\tau_1+\tau_2)}{s^2+s(1+KoKd\tau_2)/(\tau_1+\tau_2)KoKd(\tau_1+\tau_2)}$$

$$\omega n = \frac{(KoKd)^{1/2}}{(\tau_1+\tau_2)^{1/2}}$$

$$\zeta = \frac{0.5(KoKd)^{1/2}(\tau_2+1/KoKd)}{(\tau_1+\tau_2)^{1/2}}$$

where ωn is natural frequency; ζ is damping factor; Ko is conversion gain of phase comparator; Kd is conversion gain of VCO; $\tau_1$ is R1 by C1; $\tau_2$ is R2 by C1; and $\tau_1$ is R2 by C2.

Figure 6:
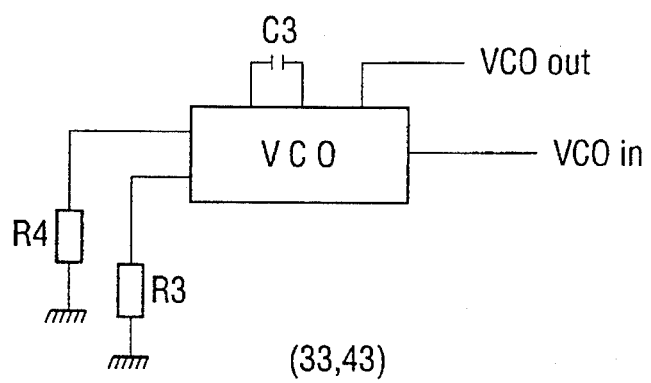
FIG. 6 is a block diagram of the first and the second voltage controlled oscillators of FIG. 1.

The first and second voltage controlled oscillators 33 and 43 are shown in detail in FIG. 6 where a resistance R3 and condenser C3 provide an intermediate frequency output of the voltage controlled oscillator. A resistance R4 is of infinite value (∞).

Figure 7A:
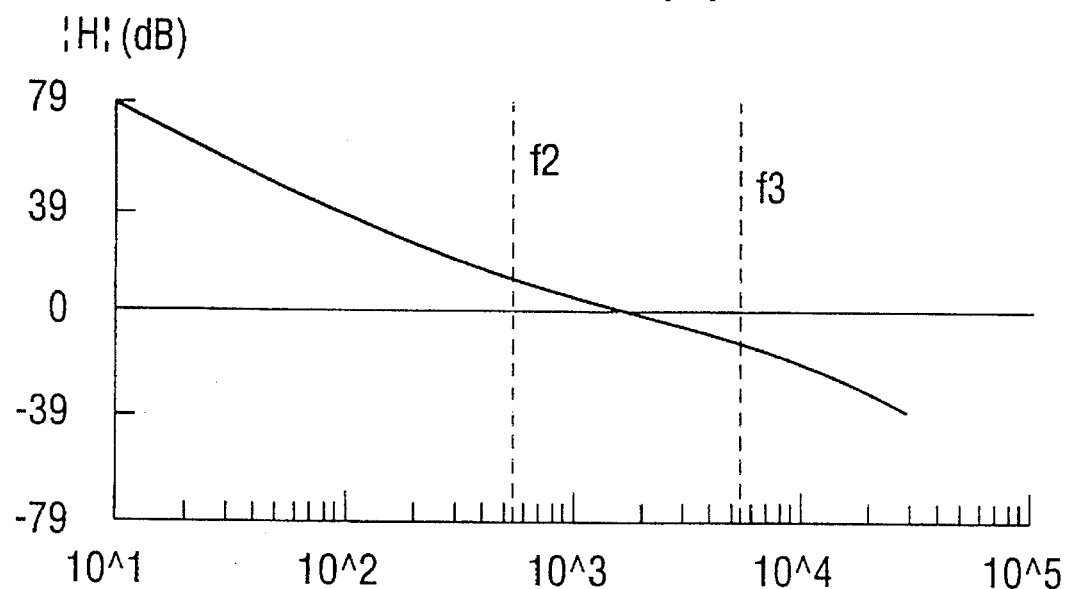
FIG. 7 shows graphs of the conversion gains and the phase characteristics of the first phase synchronizing loop.
Figure 7B:
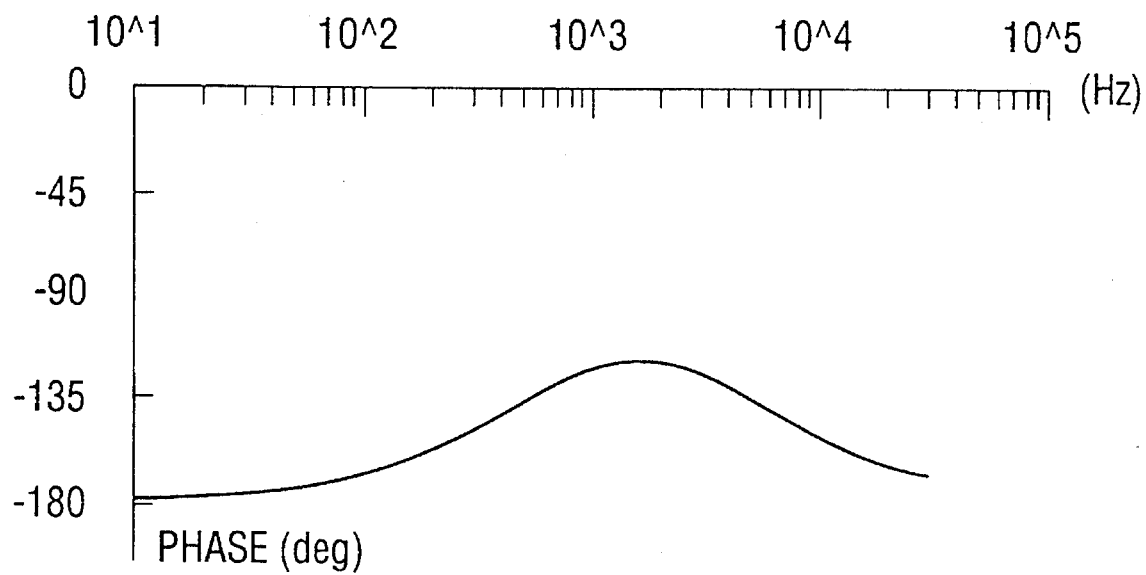
Figure 8A:
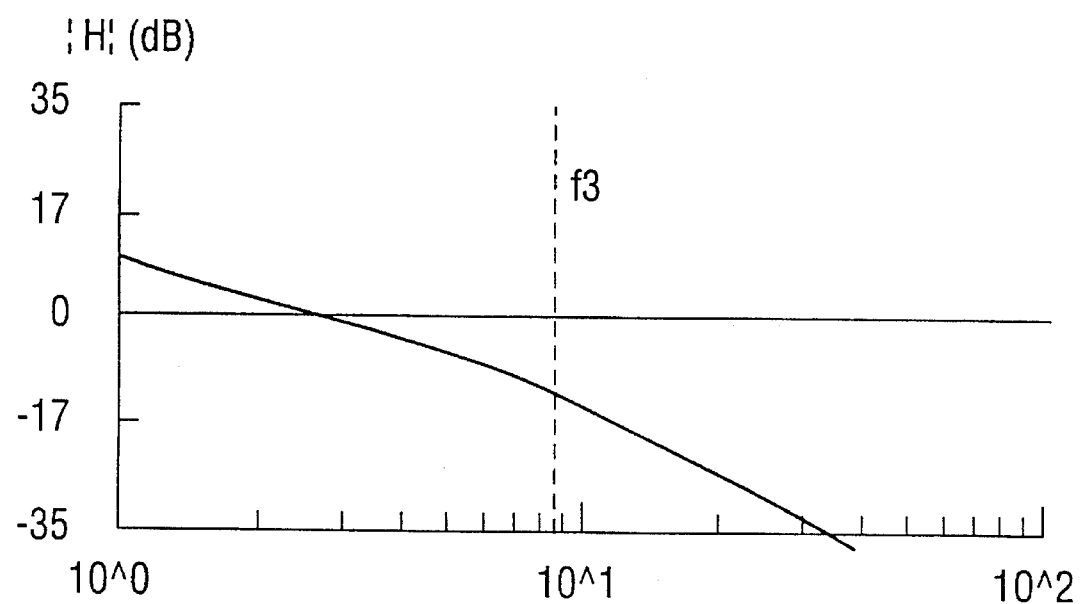
FIG. 8 is similar to FIG. 7, but is directed to the second phase synchronizing loop.
Figure 8B:
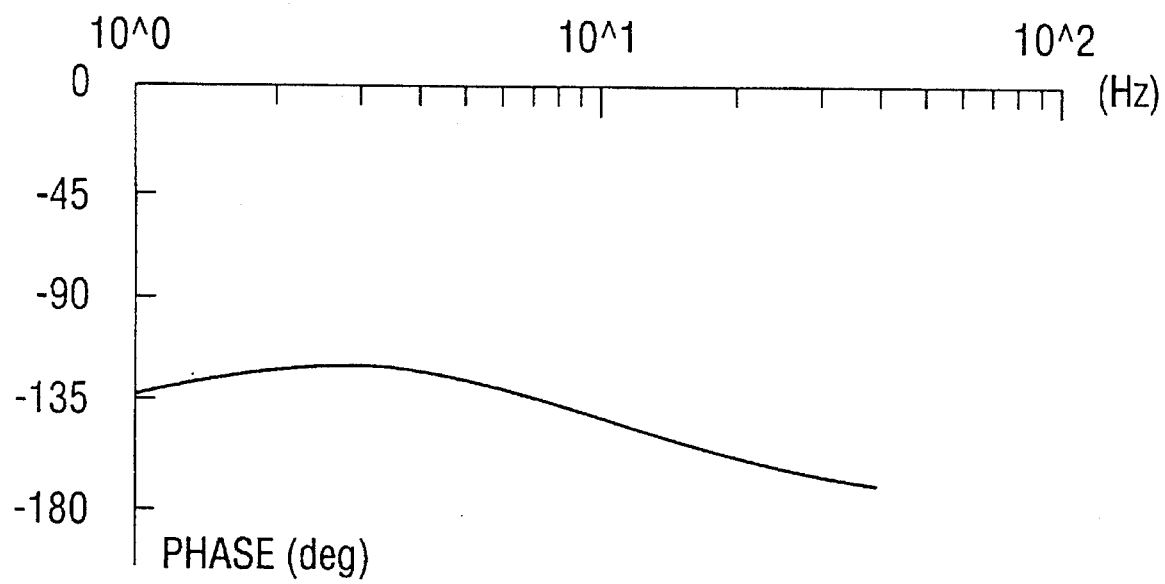

The first and the second phase synchronizing loops 30 and 40 have the conversion gains and the phase characteristics shown in FIGS. 7 and 8, respectively.

According to the invention, as described in the foregoing, a rising and falling edges of the sync signal in the transmitted data signals from the picture system are detected for generating a clock signal in accordance with a plurality of audio data formats, and the clock signal is applied to phase synchronizing loop means to derive a phase synchronizing loop frequency which is kept at a determined degree until the system is reset. According to the invention, sync signals which are shifted from each other are detected in accordance with digital audio formats as the audio data transmitted are applied. The sync signals are applied to the phase synchronizing loops which apply frequency signals. The signals are phase-compared with a signal divided according to the audio formats as a reference. A phase difference signal thus provided is low-pass filtered to control the voltage controlled oscillator for generating a desired phase synchronizing loop frequency which can be thus kept at a determined degree until the system is reset.

What is claimed is:

1. A phase synchronizing loop apparatus for a digital audio signal having sync signals contained therein, comprising:

an edge detector for detecting pulse edges of the digital audio signal and for outputting a pulse signal corresponding to the detected pulse edges of the digital audio signal;

a clock generator for retaining the pulse signal output from said edge detector for a predetermined period of time and for generating a corresponding clock signal having a frequency corresponding to a timing of the sync signals contained in the digital audio signals;

first and second phase synchronizing loops for receiving said clock signal from said clock generator and for outputting a corresponding data transmission clock signal, said first and second synchronizing loops including at least one voltage controlled oscillator and means for detecting a phase difference between the clock signal and an oscillation output of said voltage controlled oscillator; and a controller for generating a control signal in accordance with an audio data format of the digital audio signal, said clock generator and said first and second phase synchronizing loops being controlled by the control signal generated by said controller.

2. The phase synchronizing loop apparatus as claimed in claim 1, further including a display for determining and displaying a synchronization state by comparing outputs from said first and the second phase synchronizing loops.

3. The phase synchronizing loop apparatus as claimed in claim 1, wherein said clock generator comprises a first clock generator for retaining the pulse signal of said edge detector for the predetermined time interval which is set by the control signal generated by said controller, and a second clock generator for converting an output of said first clock generator into the clock signal.

4. The phase synchronizing loop apparatus as claimed in claim 1 wherein said first phase synchronizing loop comprises a first phase comparator for phase-comparing the clock signal output from said clock generator and a first reference signal to generate a first phase difference signal, a first loop filter for low-pass filtering the first phase difference signal from said first phase comparator to generate a first low-pass filtered signal, a first voltage controlled oscillator for oscillating according to said first low-pass filter signal at a central frequency on the order of 21.333 kilo Hertz, and a multiplier for multiplying an output of said first voltage controlled oscillator at a selected one of a plurality of multiplication rates to generate said reference signal, the one of the plurality of multiplication rates being selected according to the control signal generated by said controller.

5. The phase synchronizing loop apparatus as claimed in claim 4, wherein said second phase synchronizing loop comprises a second phase comparator for phase-comparing the output from said first voltage controlled oscillator and a second reference signal to generate a second phase difference signal, a second loop filter for low-pass filtering the second phase difference signal from said second phase comparator to generate a second low-pass filtered signal, a second voltage controlled oscillator for oscillating according to said second low-pass filter signal at a central frequency on the order of 18.432 kilo Hertz, and a first and second dividers for dividing an output of said second voltage controlled oscillator at a selected one of a plurality of dividing rates to generate said second reference signal, the one of the plurality of dividing rates being selected according to the control signal generated by said controller.

* * * * *